United States Patent
Holt et al.

(10) Patent No.: US 9,882,052 B2
(45) Date of Patent: Jan. 30, 2018

(54) FORMING DEFECT-FREE RELAXED SIGE FINS

(71) Applicant: GLOBALFOUNDRIES Inc., Grand Cayman (KY)

(72) Inventors: Robert Judson Holt, Ballston Lake, NY (US); Jinping Liu, Ballston Lake, NY (US); Jody Fronheiser, Delmar, NY (US); Bharat Krishnan, Clifton Park, NY (US); Churamani Gaire, Clifton Park, NY (US); Timothy James McArdle, Ballston Lake, NY (US); Murat Kerem Akarvardar, Saratoga Springs, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/197,892

(22) Filed: Jun. 30, 2016

(65) Prior Publication Data

US 2018/0006155 A1    Jan. 4, 2018

(51) Int. Cl.
| | |
|---|---|
| *H01L 21/335* | (2006.01) |
| *H01L 29/78* | (2006.01) |
| *H01L 21/265* | (2006.01) |
| *H01L 21/324* | (2006.01) |
| *H01L 21/762* | (2006.01) |
| *H01L 21/02* | (2006.01) |
| *H01L 27/088* | (2006.01) |

(52) U.S. Cl.
CPC .... *H01L 29/7849* (2013.01); *H01L 21/02381* (2013.01); *H01L 21/02532* (2013.01); *H01L 21/26533* (2013.01); *H01L 21/26586* (2013.01); *H01L 21/324* (2013.01); *H01L 21/76224* (2013.01); *H01L 27/0886* (2013.01)

(58) Field of Classification Search
CPC ......... H01L 21/02532; H01L 29/66795; H01L 29/785; H01L 21/823821; H01L 27/0924; H01L 21/823807; H01L 21/845; H01L 27/1211; H01L 21/82378; H01L 21/02381; H01L 29/0649; H01L 29/1054; H01L 21/823431; H01L 27/0886; H01L 21/823878
See application file for complete search history.

(56) References Cited

U.S. PATENT DOCUMENTS

| | | | | |
|---|---|---|---|---|
| 9,349,658 | B1 * | 5/2016 | Jacob | H01L 21/845 |
| 9,524,969 | B1 * | 12/2016 | Balakrishnan | H01L 27/0924 |
| 2011/0260282 | A1 * | 10/2011 | Kawasaki | H01L 21/76229 257/506 |

(Continued)

*Primary Examiner* — Khiem D Nguyen
(74) *Attorney, Agent, or Firm* — Ditthavong & Steiner, P.C.

(57) ABSTRACT

A method of forming defect-free relaxed SiGe fins is provided. Embodiments include forming fully strained defect-free SiGe fins on a first portion of a Si substrate; forming Si fins on a second portion of the Si substrate; forming STI regions between adjacent SiGe fins and Si fins; forming a cladding layer over top and side surfaces of the SiGe fins and the Si fins and over the STI regions in the second portion of the Si substrate; recessing the STI regions on the first portion of the Si substrate, revealing a bottom portion of the SiGe fins; implanting dopant into the Si substrate below the SiGe fins; and annealing.

15 Claims, 12 Drawing Sheets

(56) References Cited

U.S. PATENT DOCUMENTS

| | | | | |
|---|---|---|---|---|
| 2014/0027816 A1* | 1/2014 | Cea | ................... | H01L 29/66545 |
| | | | | 257/192 |
| 2014/0113420 A1* | 4/2014 | Sargunas | ........ | H01L 21/823821 |
| | | | | 438/231 |
| 2014/0357060 A1* | 12/2014 | Liu | ................... | H01L 21/02664 |
| | | | | 438/479 |
| 2015/0318397 A1* | 11/2015 | Zhu | ................ | H01L 21/823431 |
| | | | | 257/192 |
| 2016/0379981 A1* | 12/2016 | Balakrishnan | ...... | H01L 27/0924 |
| | | | | 257/192 |

* cited by examiner

FORMING DEFECT-FREE RELAXED SIGE FINS

TECHNICAL FIELD

The present disclosure relates to the manufacture of semiconductor devices, such as integrated circuits (ICs). The present disclosure is particularly applicable to forming defect-free relaxed silicon germanium (SiGe) fins for field effect transistors (FETs), particularly for the 7 nanometer (nm) technology node and beyond.

BACKGROUND

Standard techniques to either deliver a fully relaxed or a defect free fin-type FET (FinFET) device include a strain relaxed buffer (SRB) or a fin condensation (e.g., oxide snowplow). However, these standard techniques cannot both yield a fully relaxed film and a defect free substrate. For example, a fully strained epitaxial SiGe growth can be made completely defect-free as deposited. However, when epitaxial (epi) growth parameters or post-deposition processing is introduced to relax the film, defects are incorporated that can result in performance degradation.

A need therefore exists for a methodology enabling preservation of the defect-free nature of the initial fully strained epitaxial growth of SiGe, while relaxing the SiGe and the resulting device.

SUMMARY

An aspect of the present disclosure is a method for forming defect-free relaxed SiGe fins by breaking the crystal lattice by a tilted implant and anneal.

Another aspect of the present disclosure is a method for forming defect-free relaxed SiGe fins by breaking the crystal lattice by selective oxidation.

Another aspect of the present disclosure is a device including defect-free relaxed SiGe fins formed by breaking the crystal lattice by a tilted implant and anneal.

Another aspect of the present disclosure is a device including defect-free relaxed SiGe fins formed by breaking the crystal lattice by selective oxidation.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming fully strained defect-free SiGe fins on a first portion of a Si substrate; forming Si fins on a second portion of the Si substrate; forming shallow trench isolation (STI) regions between adjacent SiGe fins and Si fins; forming a cladding layer over top and side surfaces of the SiGe fins and the Si fins and over the STI regions in the second portion of the Si substrate; recessing the STI regions on the first portion of the Si substrate, revealing a bottom portion of the SiGe fins; implanting a dopant into the Si substrate below the SiGe fins; and annealing.

Aspects of the present disclosure include methods for forming the SiGe fins by recessing the Si substrate; epitaxially growing a SiGe layer in the recess; and etching the SiGe layer. Another aspect includes a method for forming the SiGe and Si fins by blanket depositing a SiGe layer over the first and second portions of the Si substrate; recessing the SiGe layer over the second portion of the Si substrate; epitaxially growing Si in the recess; implanting germanium (Ge) in the SiGe layer in the first portion of the Si substrate; and etching the Si and SiGe layers. Further aspects include recessing the STI regions below a bottom surface of the SiGe layer in both the first and second portions of the Si substrate; and implanting the dopant in the Si substrate below the SiGe fins and the Si fins. Other aspects include recessing the STI regions 30 to 100 nanometers (nm). Additional aspects include forming the cladding layer of nitride, oxynitride, low-k dielectric material, or silicon oxycarbide (SiOC). Another aspect includes implanting the dopant into the substrate below the SiGe fins by a tilted implantation at an angle of 1 to 25°. Other aspects include annealing by rapid thermal anneal (RTA).

A further aspect includes a method including forming fully strained defect-free SiGe fins on a first portion of a Si substrate; forming Si fins on a second portion of the Si substrate; forming STI regions between adjacent SiGe fins and Si fins; forming a cladding layer over top and side surfaces of the SiGe fins and the Si fins and over the STI regions in the second portion of the Si substrate; and oxidizing a bottom portion of the SiGe fins through the STI regions until the STI regions at opposite sides of each SiGe fin are joined beneath the SiGe fin.

Aspects of the present disclosure include forming the SiGe fins by recessing the Si substrate; epitaxially growing a SiGe layer in the recess; and etching the SiGe layer. Another aspect includes forming the SiGe and Si fins by: blanket depositing a SiGe layer over the first and second portions of the Si substrate; recessing the SiGe layer over the second portion of the Si substrate; epitaxially growing Si in the recess; implanting Ge in the SiGe layer in the first portion of the Si substrate; and etching the Si and SiGe layers. Further aspects include oxidizing the SiGe layer under the Si fins. Other aspects include forming the cladding layer of nitride, oxynitride, low-k dielectric material, or SiOC. Additional aspects include oxidizing by RTA. Other aspects include oxidizing at a temperature of 1050° C. to 1150° C. for 10 seconds to 100 seconds.

Another aspect of the present disclosure is a device including: fully strained defect-free SiGe fins, each having a top portion and a bottom portion, on a first portion of a Si substrate; Si fins, each having a top portion and a bottom portion, on a second portion of the Si substrate; STI regions between adjacent SiGe fins and Si fins, the STI regions being below a bottom surface of the SiGe fins and below the top portion of the Si fins; a cladding layer over top and side surfaces of the top portions of the SiGe fins and the Si fins and over the STI regions in the second portion of the Si substrate; and a dopant implanted into the Si substrate below the SiGe fins.

Aspects of the device include the SiGe fins including a first SiGe material over a second SiGe material, the first SiGe material having a higher concentration of Ge than the second SiGe material; the Si fins including a Si material over the second SiGe material; and the dopant being implanted in the Si substrate under the second SiGe material of the Si fins and under the SiGe fins. Other aspects include the cladding layer including nitride, oxynitride, low-k dielectric material, or SiOC.

A further aspect of the present disclosure is a device including: fully strained defect-free SiGe fins on a first portion of a Si substrate; Si fins on a second portion of the Si substrate; STI regions between adjacent SiGe fins and Si fins; and a cladding layer over top and side surfaces of the SiGe fins and the Si fins and over the STI regions in the second portion of the Si substrate, wherein a bottom portion of the SiGe fins is oxidized.

Aspects of the device include the SiGe fins including a first SiGe material over a second SiGe material, the first SiGe material having a higher concentration of Ge than the second SiGe material; the Si fins including a Si material over the second SiGe material; and a bottom portion of the second SiGe material of both the SiGe fins and the Si fins is oxidized.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of strain or defects attendant upon forming FinFET device with SRBs or fin condensation. In accordance with embodiments of the present disclosure, a fully strained, defect-free SiGe is grown patterned. Then, using a protective cladding on the SiGe fins a tilted implant and anneal or a selective oxidation through the STI is performed to break the crystal lattice. In the case of a tilted implant and anneal the connection to the substrate is retained, whereas in case of selective oxidation the SiGe fins effectively become silicon-on-insulator (SOI).

Methodology in accordance with embodiments of the present disclosure includes forming fully strained defect-free SiGe fins on a first portion of a Si substrate. Then, Si fins are formed on a second portion of the Si substrate. Next, STI regions are formed between adjacent SiGe fins and Si fins. Subsequently, a cladding layer is formed over top and side surfaces of the SiGe fins and the Si fins and over the STI regions in the second portion of the Si substrate. Then, the STI regions are recessed on the first portion of the Si substrate, revealing a bottom portion of the SiGe fins. Next, dopants are implanted into the Si substrate below the SiGe fins followed by an anneal.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1A:
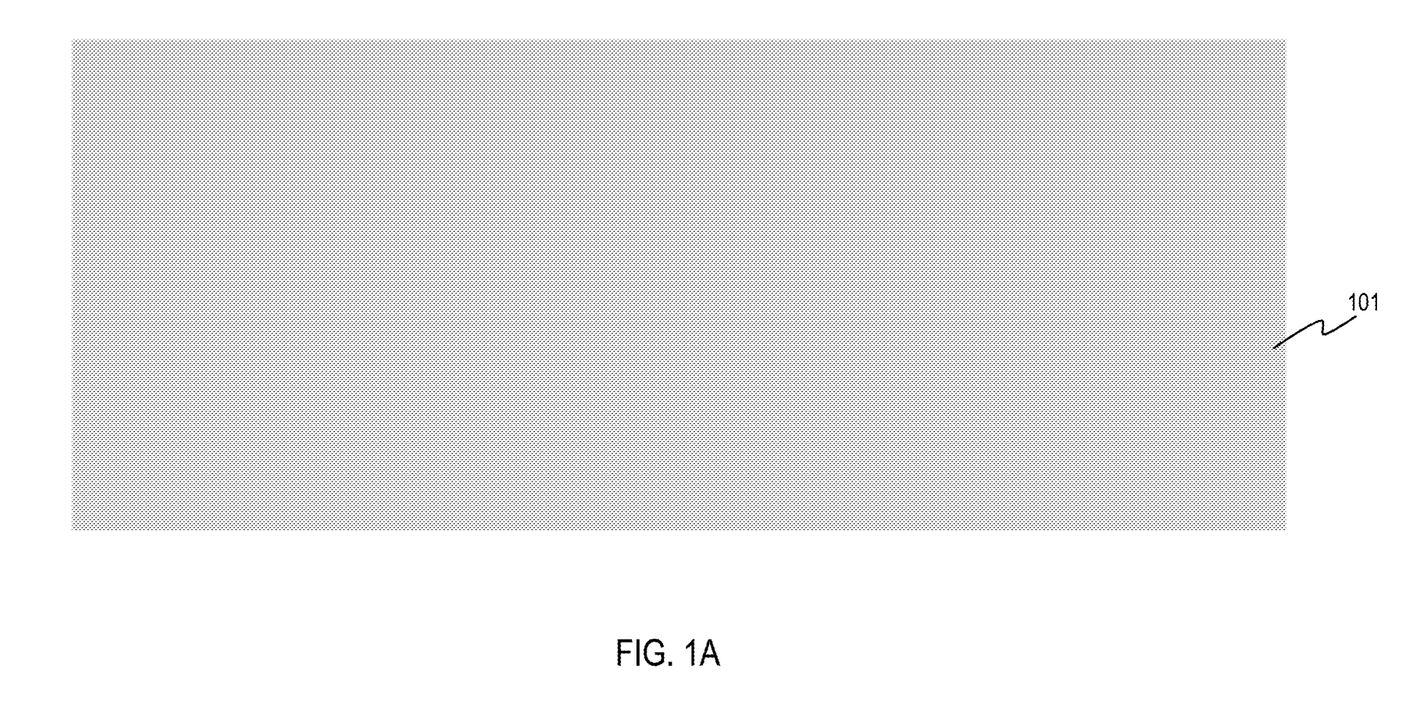
FIGS. 1A through 1E schematically illustrate formation of defect-free relaxed SiGe fins by a tilted implant and anneal, in accordance with an exemplary embodiment.
Figure 1B:
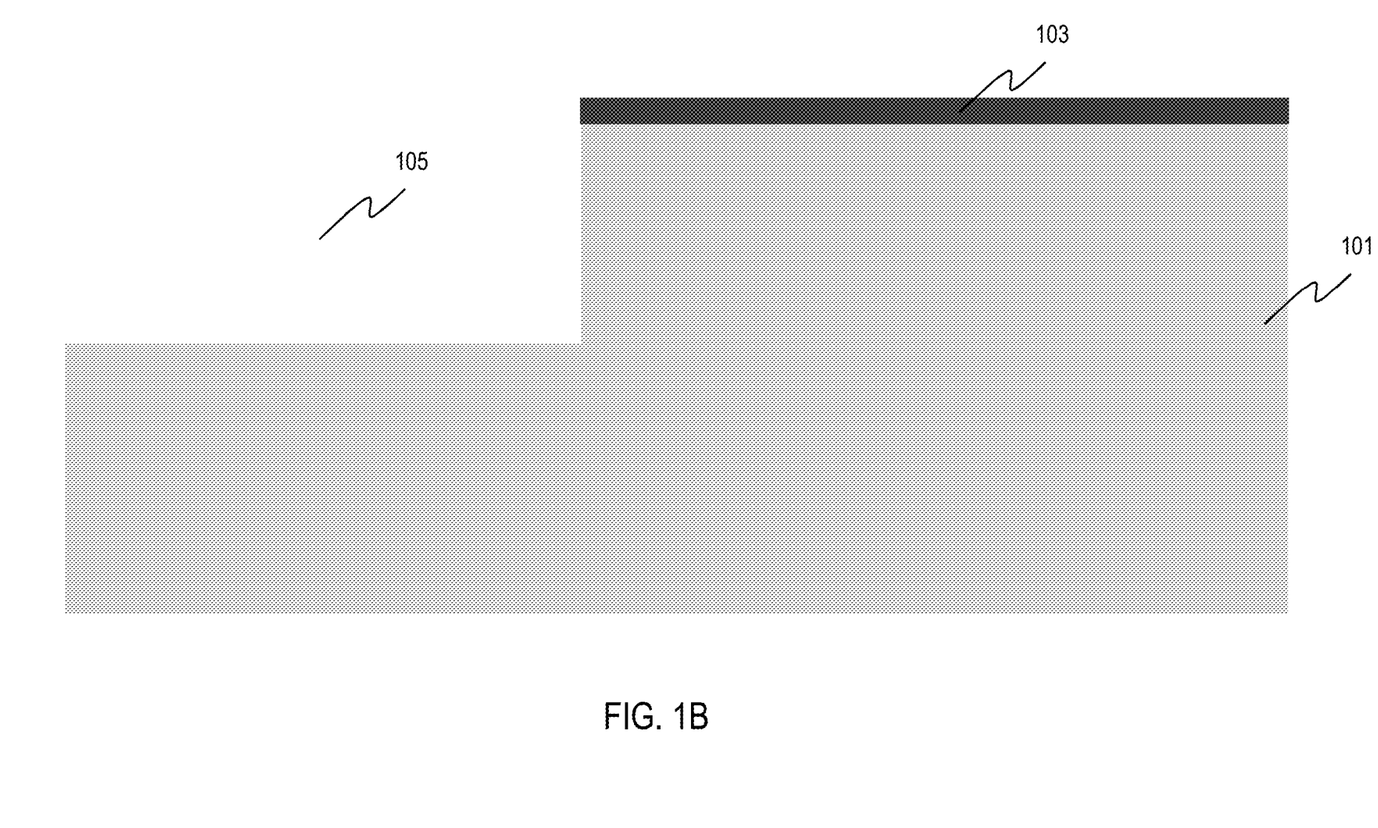
Figure 1C:
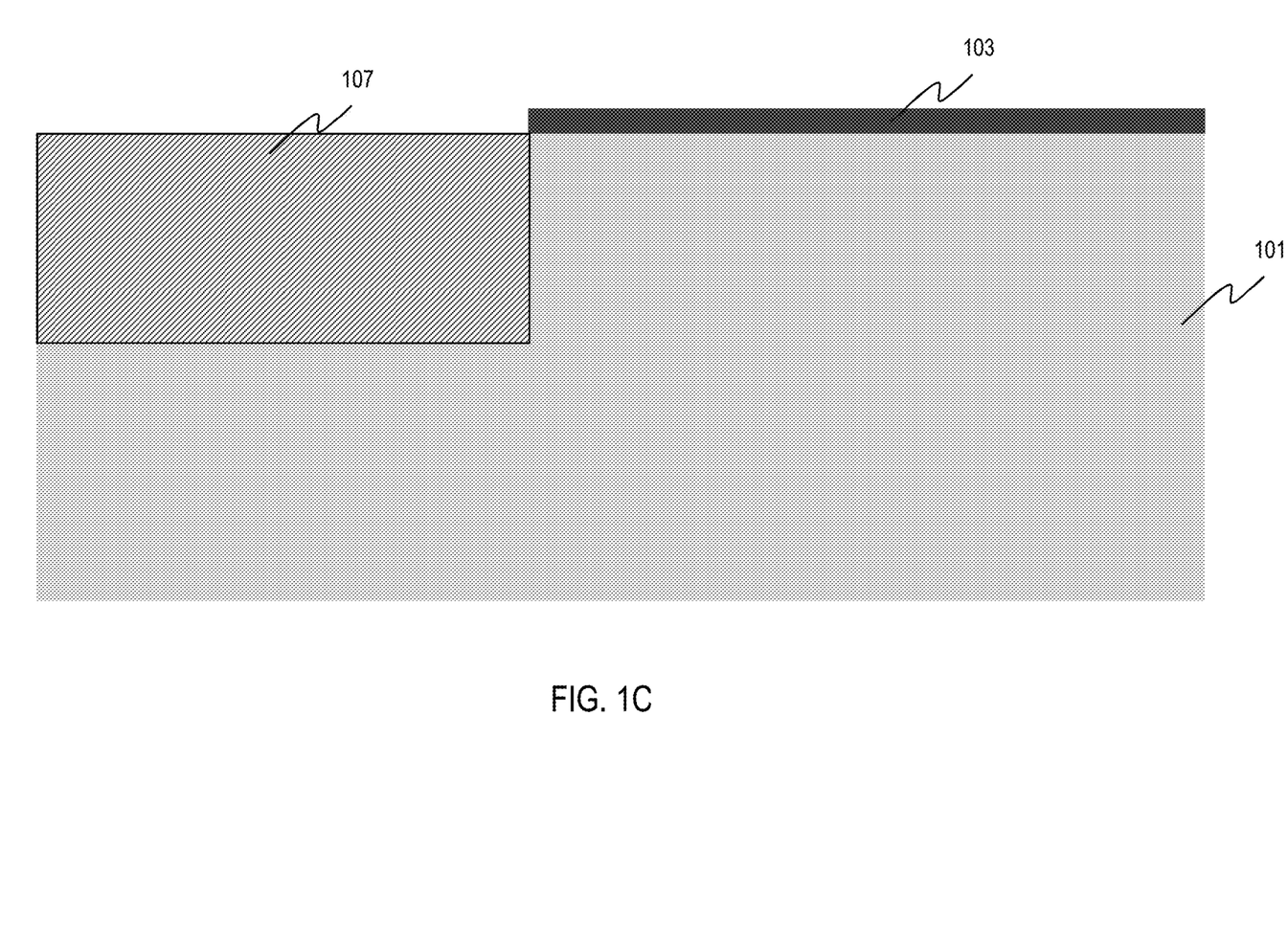
Figure 1D:
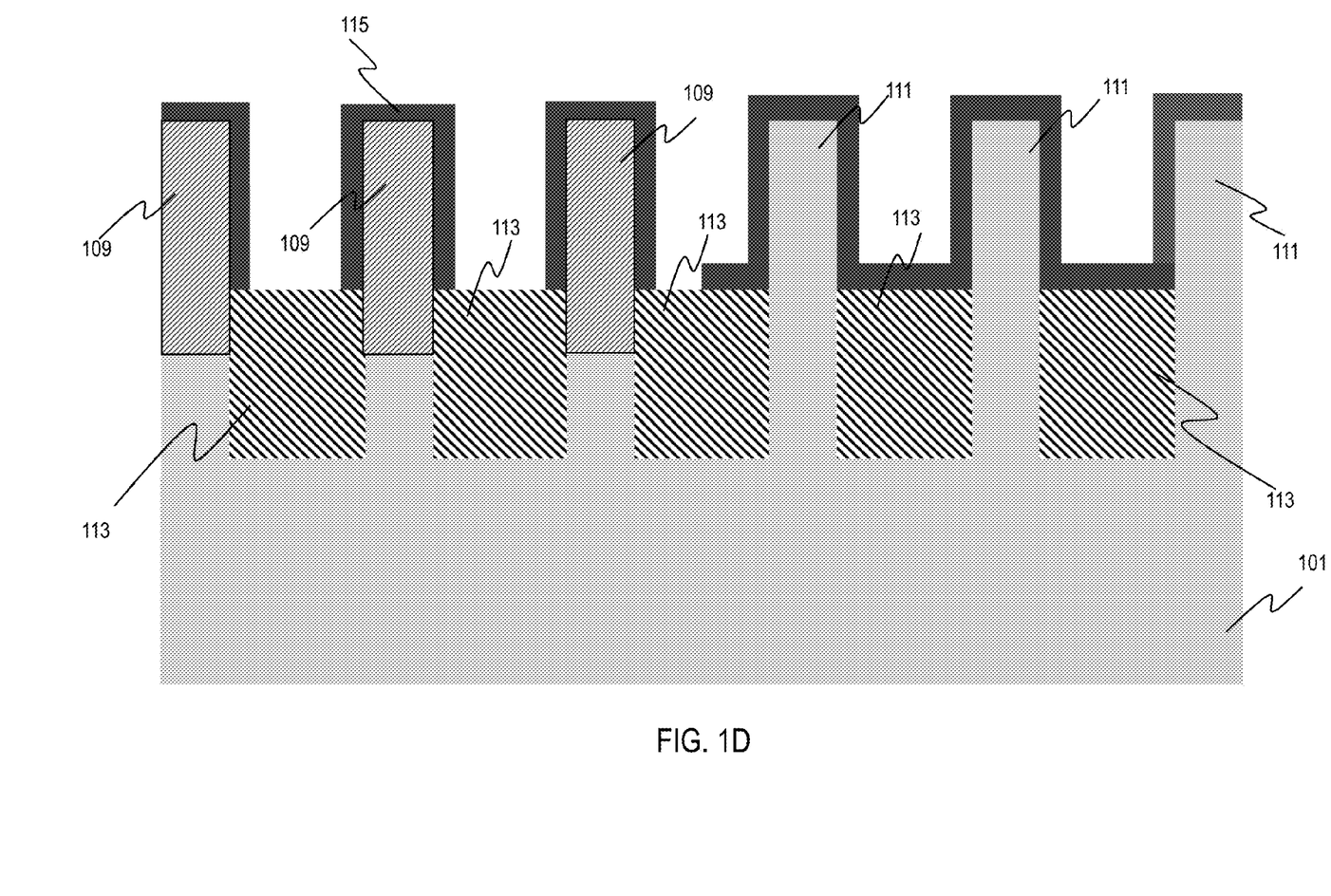
Figure 1E:
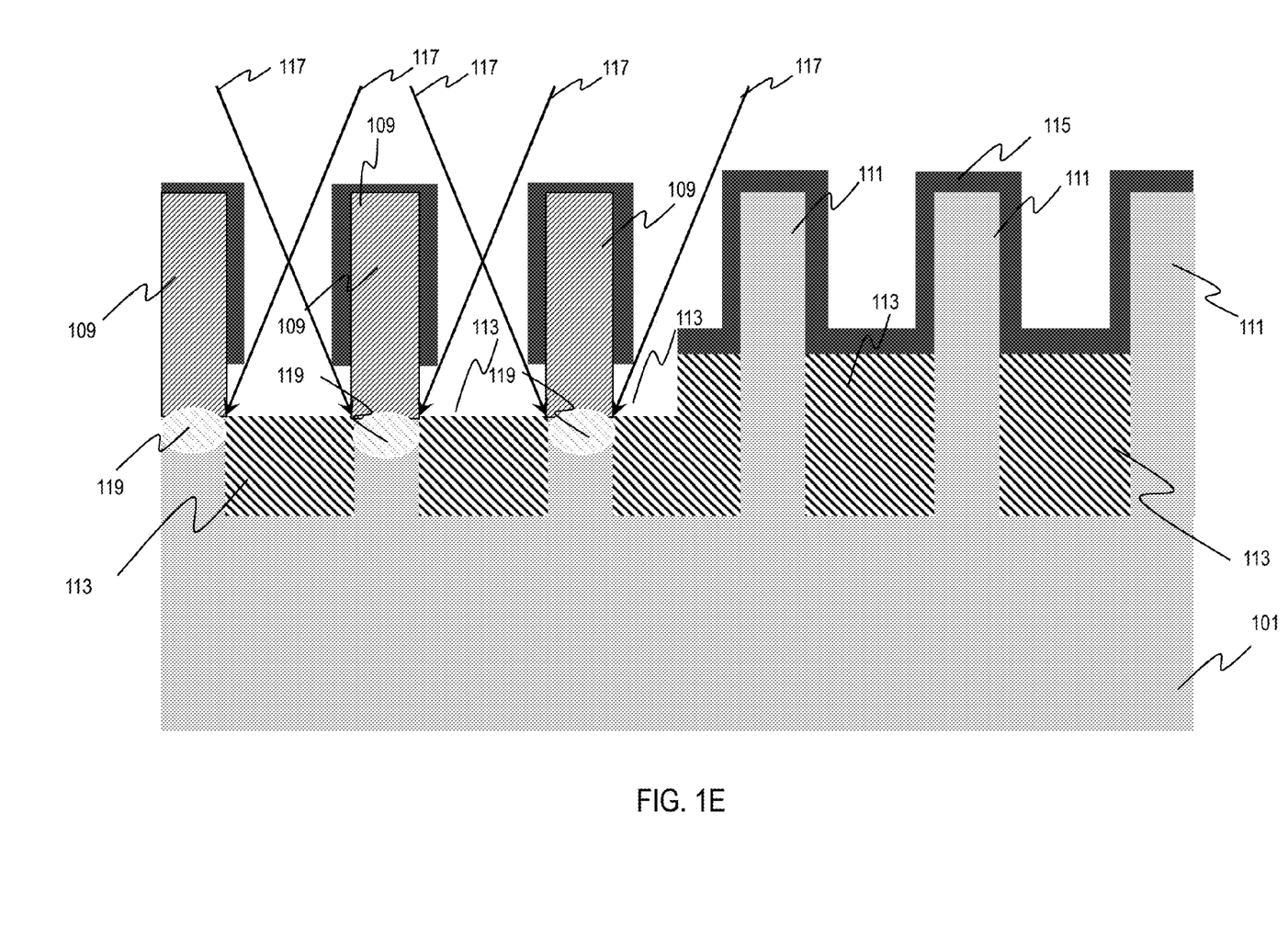

Adverting to, FIGS. 1A through 1E formation of defect-free relaxed SiGe fins by a tilted implant and anneal is illustrated, in accordance with an exemplary embodiment. FIG. 1A represents a Si substrate 101. The substrate may alternatively be SOI. Adverting to FIG. 1B, a hardmask 103 is formed over part of the Si substrate 101. Then, a recess 105 is formed in the rest of the Si substrate 101 to a depth of 10 nm to 100 nm, for example by etching. As illustrated in FIG. 1C, a SiGe layer 107 is epitaxially grown in the recess 105. If necessary, chemical mechanical polishing (CMP) is performed to planarize the SiGe. The SiGe is fully strained and defect-free. In FIG. 1D, the SiGe layer 107 is etched to form SiGe fins 109, which continue to be fully strained and defect-free. In addition, the hardmask 102 is removed, and the underlying Si substrate 101 is etched to form Si fins 111. The SiGe fins 109 and Si fins 111 may, for example, have a pitch of 10 nm to 40 nm and a width of 2 nm to 15 nm. Subsequently, STI regions 113 are formed between adjacent SiGe fins 109 and Si fins 111. The STI region is formed to a width of 10 nm to 35 nm and a depth of 30 nm to 100 nm. Next, a cladding layer 115 is formed to a thickness of 5 nm to 10 nm over top and side surfaces of the SiGe fins 109 and Si fins 111 and over the STI regions around the Si fins 111. The cladding layer is formed of nitride, oxynitride, low-k dielectric material, or silicon oxy-carbide (SiOC). Adverting to FIG. 1E, the STI regions 113 around the SiGe fins 109 are recessed 10 nm to 20 nm from the top of the STI to reveal a bottom portion of the SiGe fins 109. Thereafter, dopants 117 are implanted into the Si substrate 101 below the SiGe fins 109 (i.e., regions 119) by a tilted implantation at an angle of 1 to 25°. The dopants may be Si, C, Ge, which may be implanted at a dose of 1e14 to 1e16 and with an energy of 1 to 3 keV. Next, the Si substrate is annealed by RTA at a temperature of 900° C. to 1150° C. for 5 seconds to 300 seconds.

Figure 2:
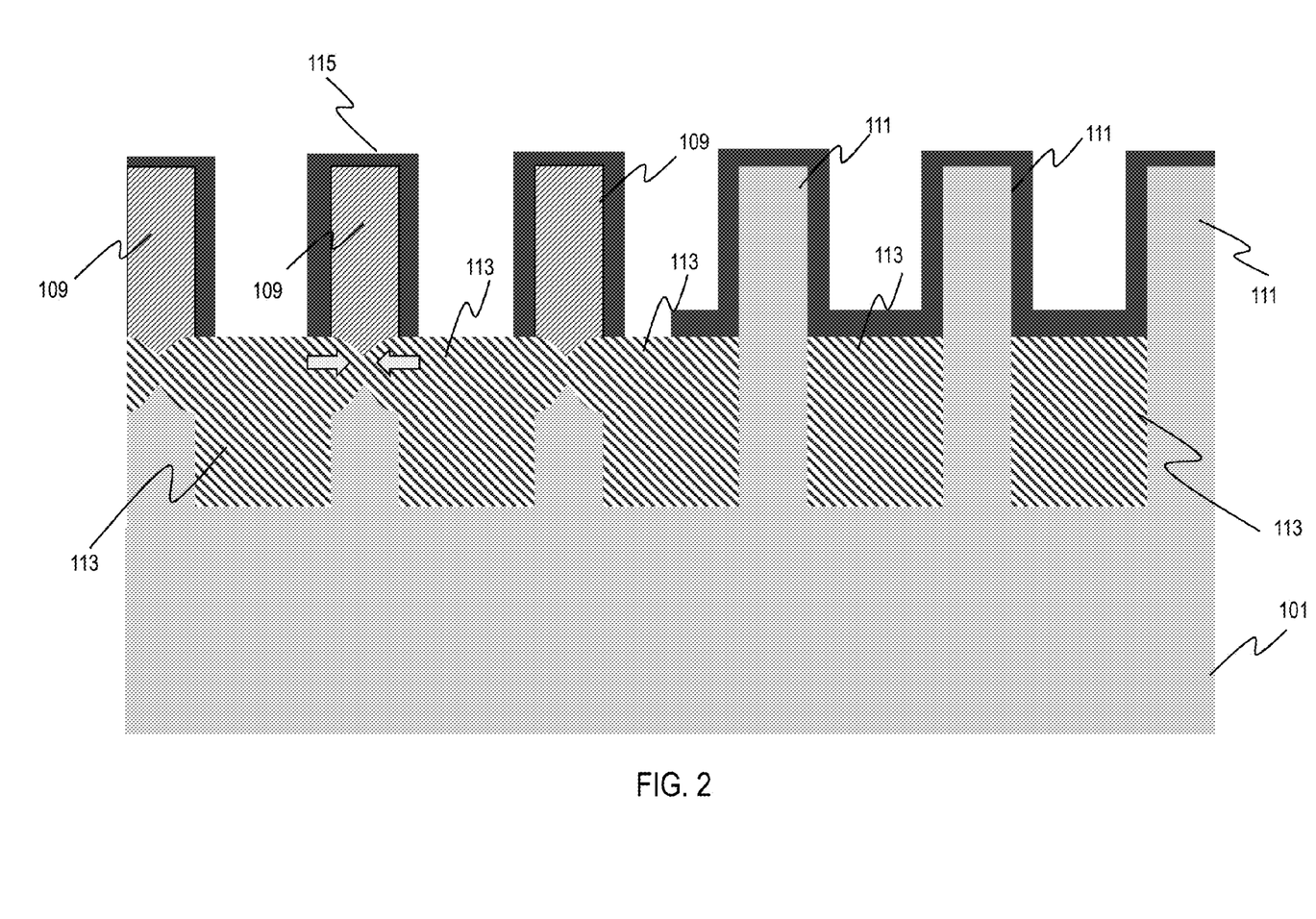
FIG. 2 schematically illustrates the method for forming defect-free relaxed SiGe fins by selective oxidation, in accordance with another exemplary embodiment.

FIG. 2 illustrates the method for forming defect-free relaxed SiGe fins by selective oxidation, in accordance with an exemplary embodiment. The embodiment illustrated in FIG. 2 begins the same as the first embodiment through FIG. 1D. Specifically, a fully strained defect-free SiGe layer 107 is epitaxially grown in a recess 105 formed in one portion of a Si substrate 101. Then, the SiGe layer 107 is etched to form SiGe fins 109. The remaining part of the Si substrate 101 is etched to form Si fins 111. STI regions 113 are formed between adjacent SiGe fins 109 and Si fins 111. A cladding layer 115 is formed over top and side surfaces of the SiGe fins 109 and Si fins 111 and over the STI regions 113 around the Si fins 111. Then, as illustrated in FIG. 2, the bottom portion of each SiGe fin 109 is oxidized through the STI regions 113 until the STI regions 113 are joined beneath the SiGe fins 109.

Figure 3A:
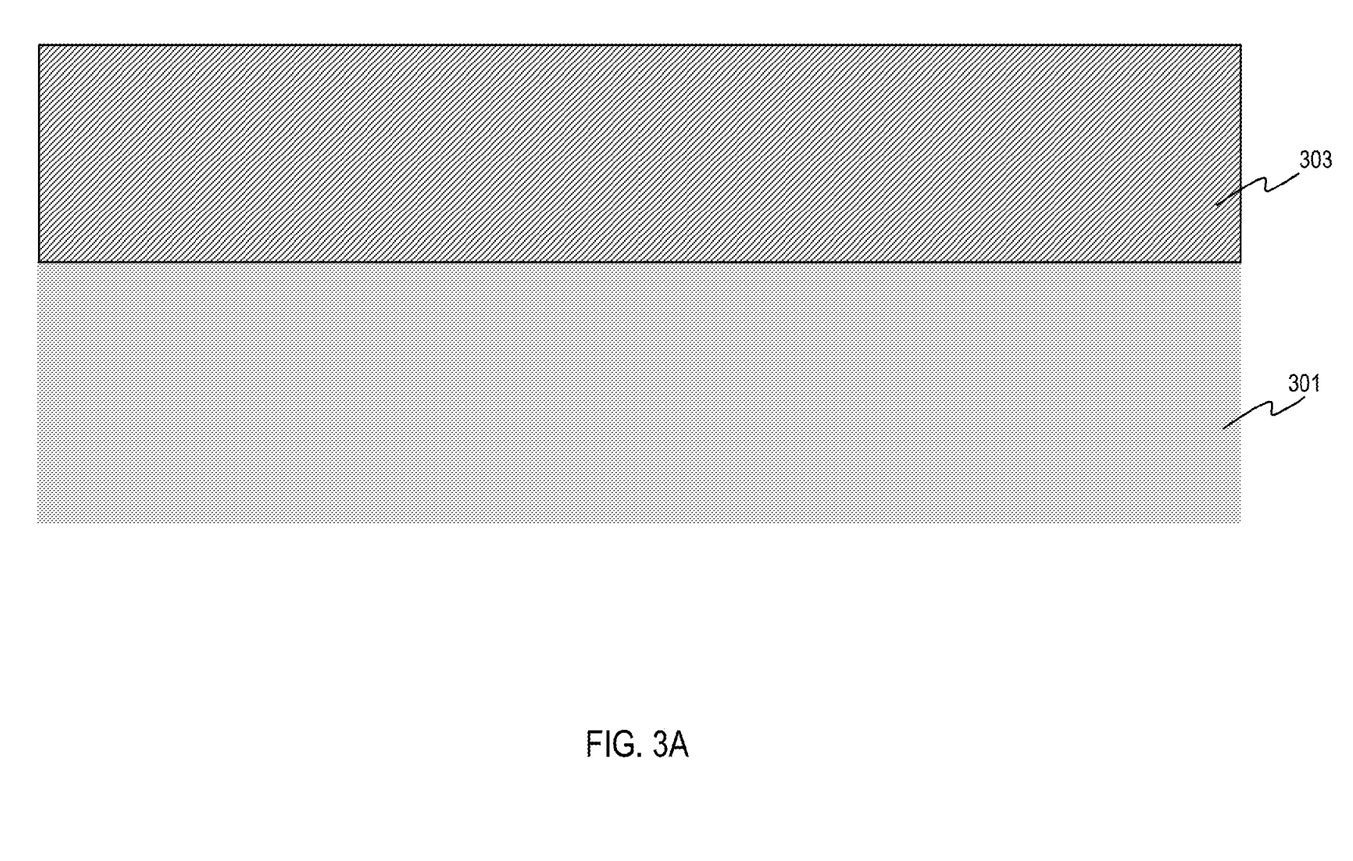
FIGS. 3A through 3E illustrate an alternative to the process of FIGS. 1A through 1E for forming of defect-free relaxed SiGe fins and Si fins by a tilted implant and anneal, in accordance with another exemplary embodiment.
Figure 3B:
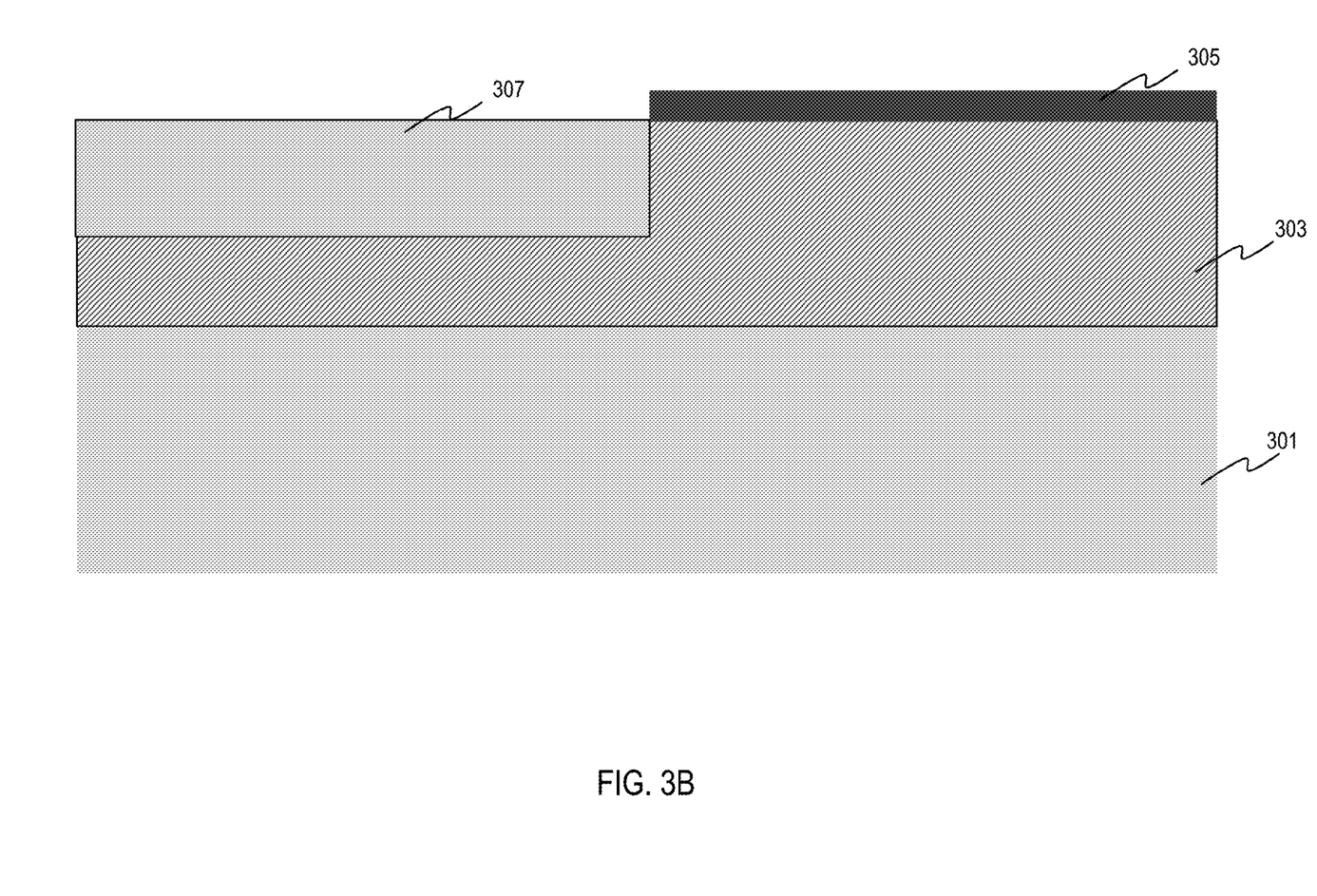
Figure 3C:
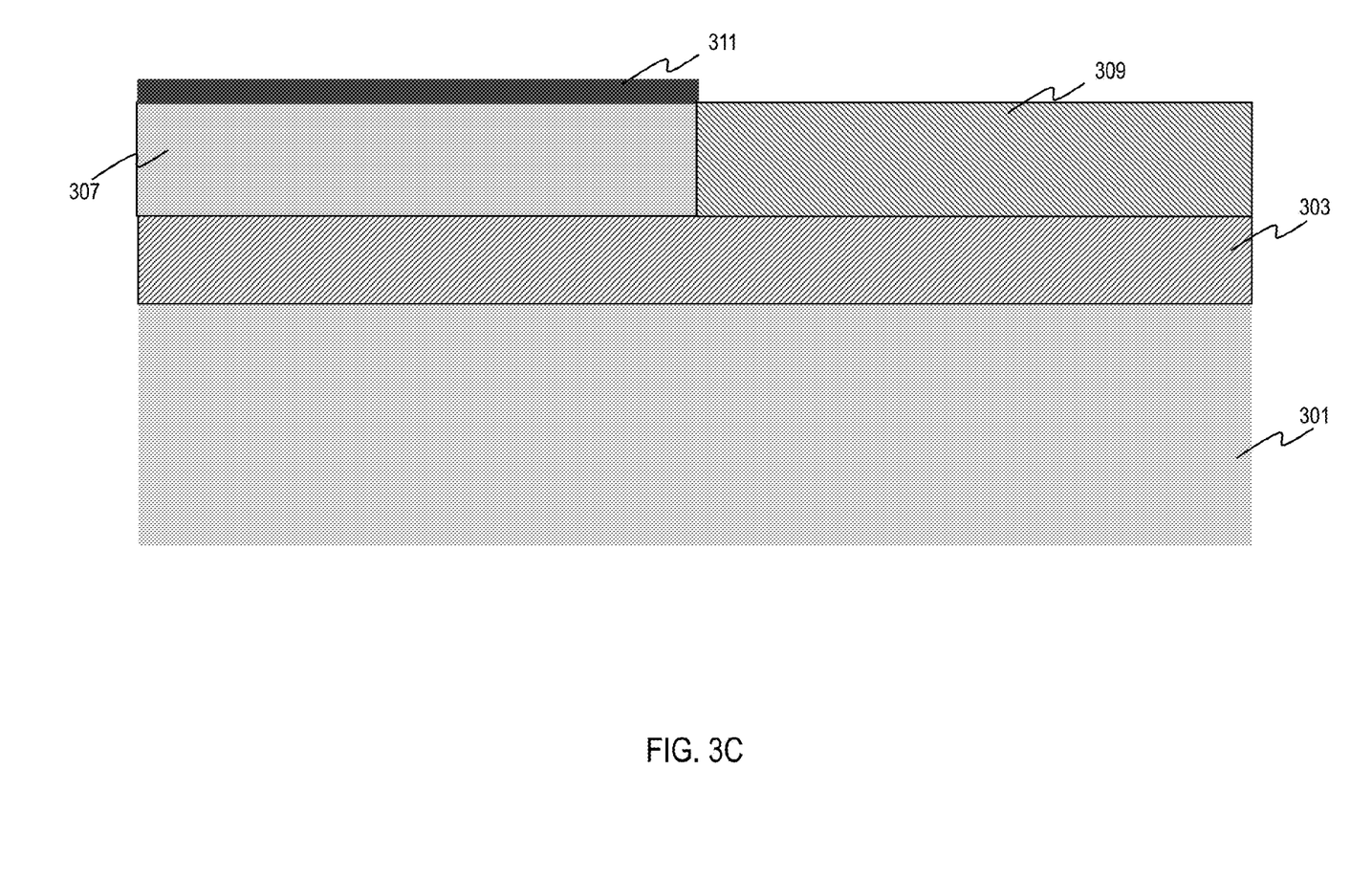
Figure 3D:
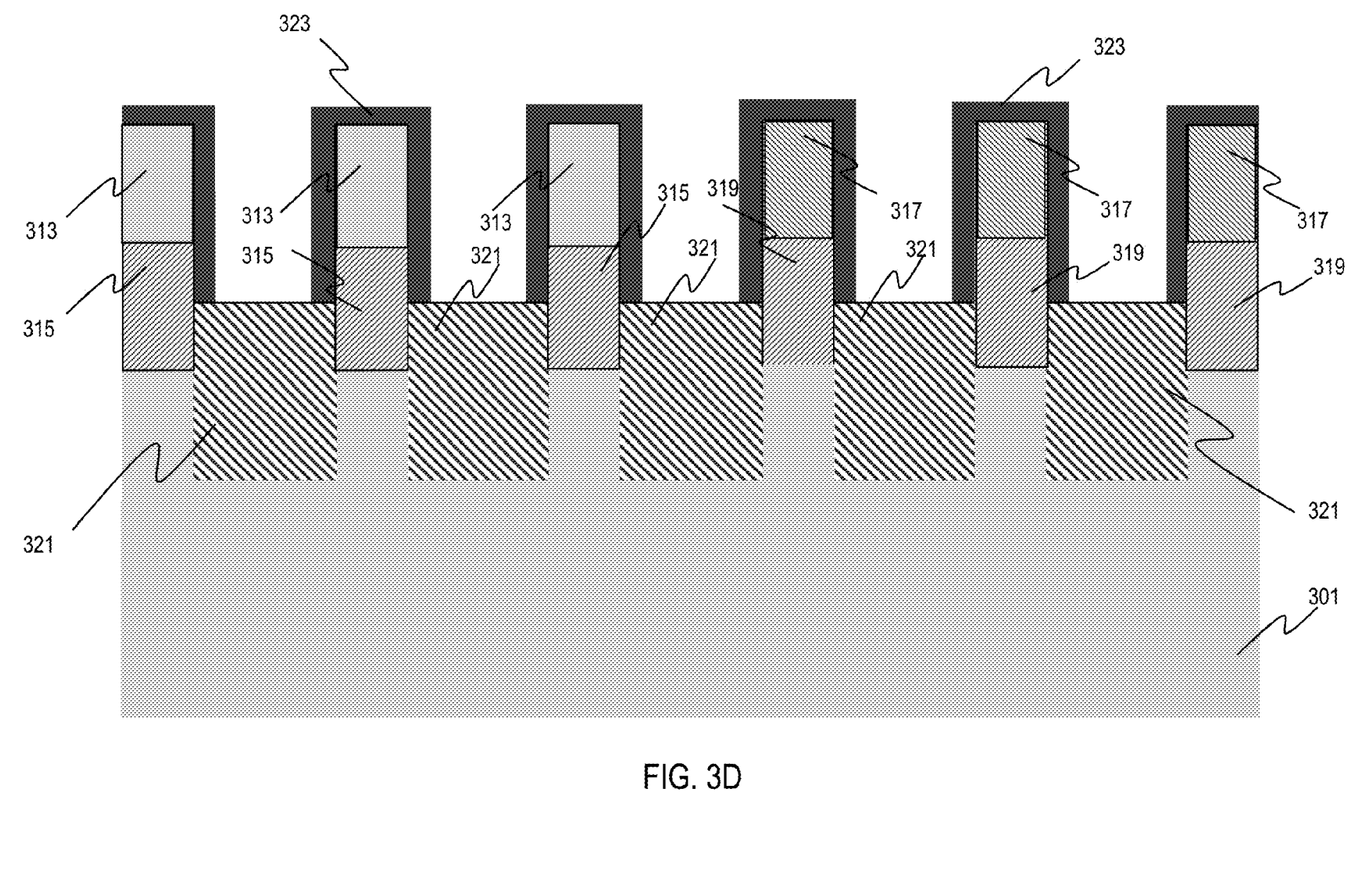
Figure 3E:
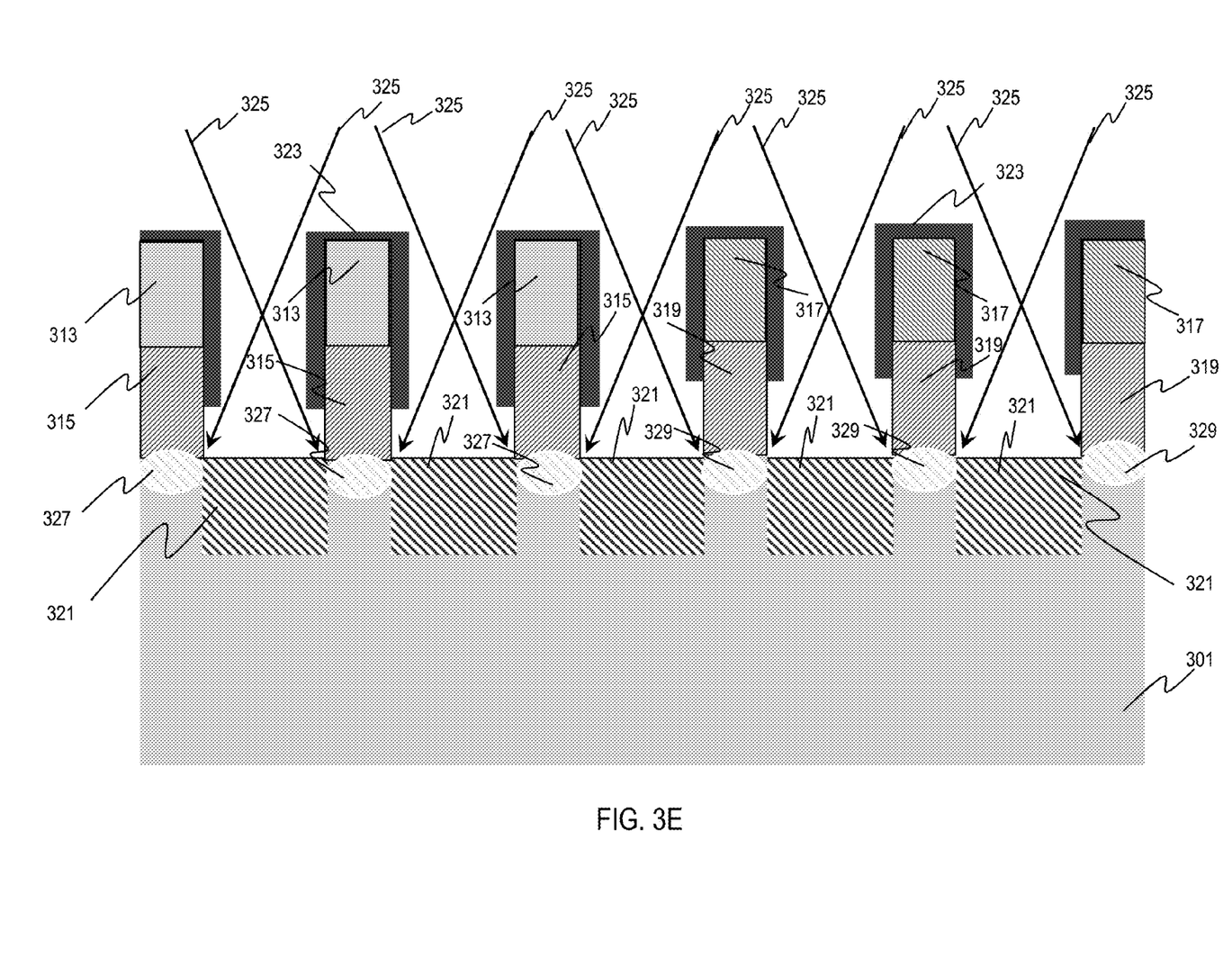

FIGS. 3A through 3E illustrate an alternative to the process of FIGS. 1A through 1E for forming of defect-free relaxed SiGe fins and Si fins by a tilted implant and anneal, in accordance with another exemplary embodiment. Adverting to FIG. 3A, a SiGe layer 303 having 20 to 30% Ge is blanket deposited over the Si substrate 301. As illustrated in FIG. 3B, the SiGe layer 303 is recessed to a depth of 10 to 40 nm over a portion of the Si substrate 301. A hardmask 305 is formed over the rest of the substrate, and Si 307 is epitaxially grown in the recess. In FIG. 3C, the hardmask 305 is removed, and a new hardmask 311 is formed over the Si 307. Then, Ge is implanted in an upper portion of the SiGe layer 303, forming SiGe layer 309 with a Ge concentration of 40 to 60%. Next, in FIG. 3D, the hardmask 311 is removed, and the Si 307 and underlying SiGe layer 303 are etched to form Si fins each having a Si top portion 313 and bottom portion 315. Correspondingly, the SiGe layer 309 and the underlying SiGe layer 303 are etched to form SiGe fins each having top portions 317 with a high Ge concentration and bottom portions 319 with a low Ge concentration. The Si fins and the SiGe fins may, for example, have a pitch of 10 nm to 40 nm and a width of 2 nm to 15 nm. Subsequently, STI regions 321 are formed between adjacent Si fins and SiGe fins. The STI regions 321 are formed to a width of 10 nm to 35 nm and a depth of 30 nm to 100 nm. A cladding layer 323 is formed to a thickness of 5 nm to 10 nm over top and side surfaces of the Si fins and SiGe fins. Adverting to FIG. 3E, the STI regions 321 are recessed to below a bottom surface of the SiGe layer, e.g. 10 to 20 nm. Dopants 325 are then implanted in the Si substrate 301 below the SiGe fins and the Si fins (i.e., regions 327 and 329). As in FIG. 1E, the dopants are implanted at an angle of 1 to 25°. The dopants may be Si, Ge, C, which may be implanted at a dose of 1e14 to 1e16 and with an energy of 1 to 3 keV. Then the substrate is annealed by RTA at a temperature of 900° C. to 1150° C. and a pressure of 10 torr to 750 torr for 5 seconds to 300 seconds.

Figure 4:
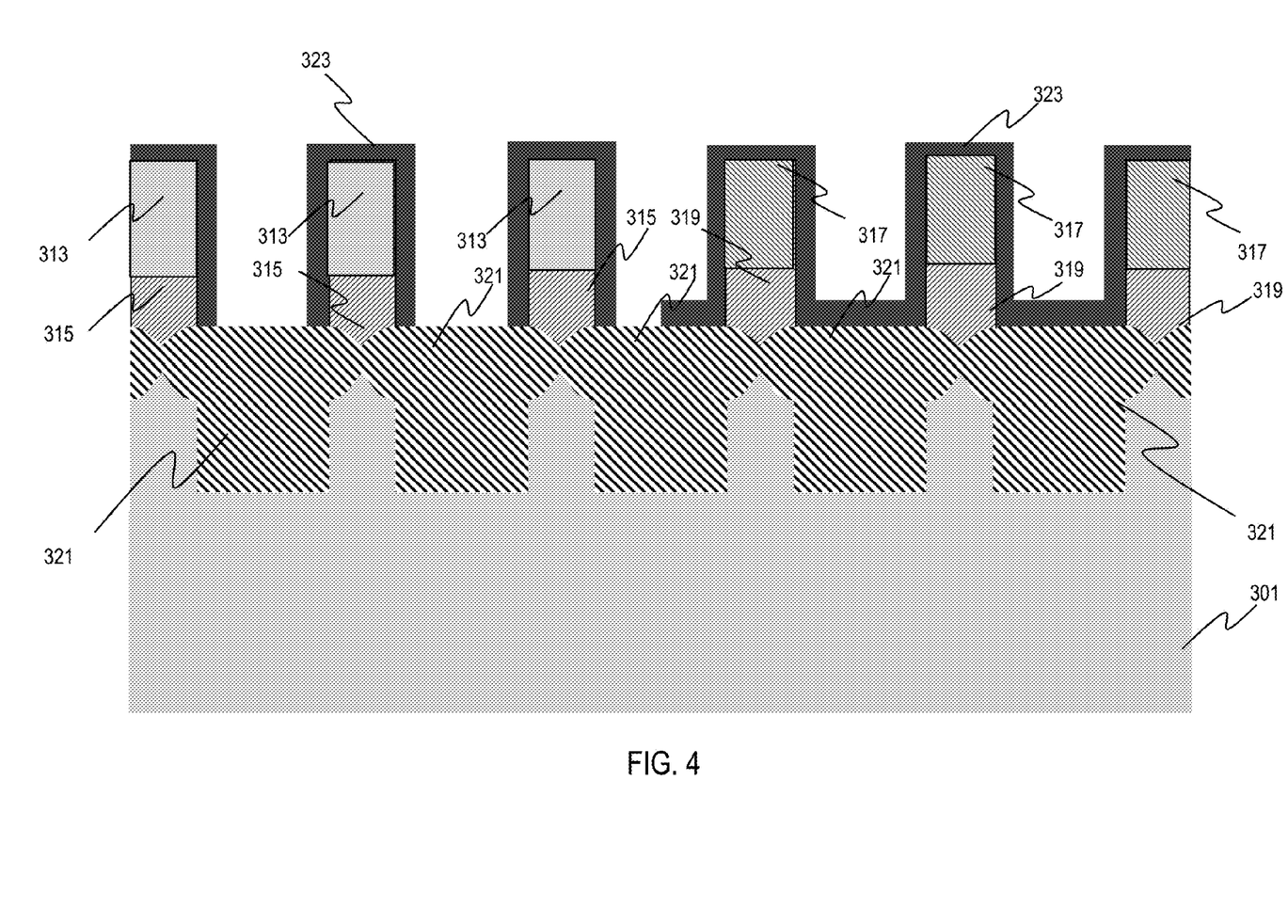
FIG. 4 illustrates an alternative to the process of FIG. 2 for forming defect-free relaxed SiGe fins and Si fins by selective oxidation, in accordance with another exemplary embodiment.

FIG. 4 illustrates an alternative to the process of FIG. 2 for forming defect-free relaxed SiGe fins and Si fins by selective oxidation, in accordance with another exemplary embodiment. The process begins the same as the embodiment illustrated in FIGS. 3A through 3E but only through FIG. 3D. Specifically, a SiGe layer 303 having a Ge concentration of 20 to 30% is blanket deposited over the Si substrate 301. The SiGe layer 303 is recessed to a depth of 10 to 40 over a portion of the Si substrate 301. Si 307 is epitaxially grown in the recess. Ge is implanted in the SiGe layer 303 on the first portion of the Si substrate 301, forming a SiGe layer 309 with a Ge concentration of 40 to 60%. Then, the Si 307 and underlying SiGe layer 303 are etched to form Si fins each having Si top portions 313 and SiGe bottom portions 315. Correspondingly, the SiGe layer 309 and the underlying SiGe layer 303 are etched to form SiGe fins each having high concentration Ge top portions 317 and low concentration Ge bottom portions 319. Subsequently, STI regions 321 are formed between adjacent Si fins and SiGe fins. Then, a cladding layer 323 is formed to a thickness of 5 nm to 10 nm over top and side surfaces of the Si fins and SiGe fins. Next, the bottom portion of the Si fins and SiGe fins are oxidized through the STI regions 321 adjacent to the Si fins and SiGe fins until the STI regions are joined beneath the Si fins and SiGe fins.

The embodiments of the present disclosure can achieve several technical effects, such as a fully relaxed and defect free FinFET devices. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated finFET semiconductor devices, particularly for the 7 nm technology node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming strained silicon germanium (SiGe) fins on a first portion of a silicon (Si) substrate;
   forming Si fins on a second portion of the Si substrate;
   forming shallow trench isolation (STI) regions between adjacent SiGe fins and Si fins;
   forming a cladding layer over top and side surfaces of the SiGe fins and the Si fins and over the STI regions in the second portion of the Si substrate but not over the STI regions in the first portion of the Si substrate;
   recessing the STI regions on only the first portion of the Si substrate, and not on the second portion of the Si substrate, revealing a bottom portion of the SiGe fins;
   implanting a dopant into the Si substrate below the SiGe fins; and
   annealing.

2. The method according to claim 1, comprising forming the SiGe fins by:
   recessing the Si substrate;
   epitaxially growing a SiGe layer in the recess; and
   etching the SiGe layer.

3. The method according to claim 1, comprising forming the SiGe and Si fins by:
   blanket depositing a SiGe layer over the first and second portions of the Si substrate;
   recessing the SiGe layer over the second portion of the Si substrate;
   epitaxially growing Si in the recess;
   implanting germanium (Ge) in the SiGe layer in the first portion of the Si substrate; and
   etching the Si and SiGe layers.

4. The method according to claim 3, comprising:
   recessing the STI regions below a bottom surface of the SiGe layer in both the first and second portions of the Si substrate; and
   implanting the dopant in the Si substrate below the SiGe fins and the Si fins.

5. The method according to claim 1, comprising recessing the STI regions 10 to 20 nanometers (nm).

6. The method according to claim 1, comprising forming the cladding layer of nitride, oxynitride, low-k dielectric material, or silicon oxycarbide (SiOC).

7. The method according to claim 1, comprising implanting the dopant into the substrate below the SiGe fins by a tilted implantation at an angle of 1 to 25°.

8. The method according to claim 1, comprising annealing by rapid thermal anneal (RTA).

9. A method comprising:
   forming strained silicon germanium (SiGe) fins on a first portion of a silicon (Si) substrate;
   forming Si fins on a second portion of the Si substrate;
   forming shallow trench isolation (STI) regions between adjacent SiGe fins and Si fins;
   forming a cladding layer over top and side surfaces of the SiGe fins and the Si fins and over the STI regions in the second portion of the Si substrate but not over the STI regions in the first portion of the Si substrate, wherein a third portion of the Si substrate, between an adjacent SiGe fin and a Si fin, wherein the cladding layer covers approximately half of an STI region in the third portion of the Si substrate; and
   oxidizing a bottom portion of the SiGe fins through the STI regions until the STI regions at opposite sides of each SiGe fin are joined beneath the SiGe fin.

10. The method according to claim 9, comprising:
    forming the SiGe fins by:
    recessing the Si substrate;
    epitaxially growing a SiGe layer in the recess; and
    etching the SiGe layer.

11. The method according to claim 9, comprising forming the SiGe and Si fins by:
    blanket depositing a SiGe layer over the first and second portions of the Si substrate;
    recessing the SiGe layer over the second portion of the Si substrate;
    epitaxially growing Si in the recess;
    implanting germanium (Ge) in the SiGe layer in the first portion of the Si substrate; and
    etching the Si and SiGe layers.

12. The method according to claim 11, further comprising oxidizing the SiGe layer under the Si fins.

13. The method according to claim 9, comprising forming the cladding layer of nitride, oxynitride, low-k dielectric material, or silicon oxycarbide (SiOC).

14. The method according to claim 9, comprising oxidizing by rapid thermal anneal (RTA).

15. The method according to claim 14, comprising oxidizing at a temperature of 1050° C. to 1150° C. for 10 seconds to 100 seconds.

* * * * *